(12) United States Patent  
Shimooka

(10) Patent No.: US 8,921,951 B2  
(45) Date of Patent: Dec. 30, 2014

(54) MEMS DEVICE AND MANUFACTURING METHOD THEREOF

(75) Inventor: Yoshiaki Shimooka, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 912 days.

(21) Appl. No.: 12/715,573

(22) Filed: Mar. 2, 2010

(65) Prior Publication Data

US 2010/0308423 A1    Dec. 9, 2010

(30) Foreign Application Priority Data

Jun. 4, 2009    (JP) .................................. 2009-135339

(51) Int. Cl.
| | |
|---|---|
| H01L 29/84 | (2006.01) |
| B81B 3/00 | (2006.01) |
| H03H 3/007 | (2006.01) |
| H03H 9/10 | (2006.01) |
| H03H 9/02 | (2006.01) |

(52) U.S. Cl.
CPC ............ B81B 3/0051 (2013.01); H03H 3/0072 (2013.01); H03H 9/1057 (2013.01); H03H 9/02259 (2013.01); *B81B 2201/0271* (2013.01); *B81C 2203/0136* (2013.01); *H03H 2009/0244* (2013.01)
USPC ............................................ 257/415; 438/50

(58) Field of Classification Search
CPC .............. G01P 15/0802; G01P 15/125; H01H 59/0009
USPC ............................................ 257/415; 438/50
See application file for complete search history.

(56) References Cited

U.S. PATENT DOCUMENTS

| | | | |
|---|---|---|---|
| 5,589,082 A | 12/1996 | Lin et al. | |
| 6,635,509 B1 * | 10/2003 | Ouellet | 438/106 |
| 6,764,936 B2 * | 7/2004 | Daneman et al. | 438/599 |
| 6,808,954 B2 * | 10/2004 | Ma et al. | 438/51 |
| 6,856,217 B1 * | 2/2005 | Clark et al. | 333/186 |
| 6,936,494 B2 * | 8/2005 | Cheung | 438/55 |
| 6,979,585 B2 * | 12/2005 | Nikkel et al. | 438/48 |
| 7,002,436 B2 * | 2/2006 | Ma et al. | 333/186 |
| 7,008,812 B1 * | 3/2006 | Carley | 438/52 |
| 7,145,213 B1 * | 12/2006 | Ebel et al. | 257/414 |

(Continued)

FOREIGN PATENT DOCUMENTS

| | | |
|---|---|---|
| JP | 2004-314289 | 11/2004 |
| JP | 2008-213061 | 9/2008 |

OTHER PUBLICATIONS

Akedo. Room Temperature Impact Consolidation (RTIC) of Fine Ceramic Powder by Aerosol Deposition Method and Applications to Microdevices, Journal of Thermal Spray Technology, vol. 17, No. 2, pp. 181-198, Jun. 2008.

*Primary Examiner* — Thao X Le  
*Assistant Examiner* — Eric Jones  
(74) *Attorney, Agent, or Firm* — White & Case LLP

(57) ABSTRACT

A MEMS device includes: a movable element supported by a supporting member on a substrate; an encapsulation structure provided above the substrate so as to encapsulate the movable element; and a fin that is made of an insulation film, provided above the substrate, and provided inside of the encapsulation structure and outside of the movable element, and a part of the fin being positioned between a height from the substrate when the movable element are turned ON and a height from the substrate when the movable element are turned OFF.

20 Claims, 13 Drawing Sheets

(56) References Cited

U.S. PATENT DOCUMENTS

| | | |
|---|---|---|
| 7,159,459 B2 * | 1/2007 | Gogoi ................... 73/504.02 |
| 7,381,583 B1 * | 6/2008 | Ebel et al. ................ 438/53 |
| 7,427,797 B2 * | 9/2008 | Ohguro et al. ............ 257/415 |
| 7,466,060 B2 * | 12/2008 | Ikehashi ................. 310/309 |
| 7,482,193 B2 * | 1/2009 | DCamp et al. ............ 438/51 |
| 7,489,212 B2 * | 2/2009 | Morita et al. ............ 333/186 |
| 7,492,019 B2 * | 2/2009 | Carley .................... 257/415 |
| 7,541,895 B2 * | 6/2009 | Tada et al. ............... 333/186 |
| 7,570,134 B2 * | 8/2009 | Koji ....................... 333/186 |
| 7,745,891 B2 * | 6/2010 | Delapierre .............. 257/415 |
| 7,972,887 B2 * | 7/2011 | Shimooka ................ 438/51 |
| 7,989,905 B2 * | 8/2011 | Watanabe et al. ........ 257/415 |
| 8,004,053 B2 * | 8/2011 | Miyagi et al. ........... 257/417 |
| 8,159,056 B1 * | 4/2012 | Kim et al. ............... 257/678 |
| 2003/0102552 A1 * | 6/2003 | Martin et al. ............ 257/704 |
| 2003/0155643 A1 * | 8/2003 | Freidhoff ................. 257/704 |
| 2004/0248344 A1 * | 12/2004 | Partridge et al. ......... 438/127 |
| 2005/0017313 A1 * | 1/2005 | Wan ....................... 257/415 |
| 2005/0250253 A1 * | 11/2005 | Cheung ................... 438/125 |
| 2006/0098059 A1 * | 5/2006 | Ohguro et al. ........... 347/72 |
| 2006/0108652 A1 * | 5/2006 | Partridge et al. ......... 257/414 |
| 2007/0042521 A1 * | 2/2007 | Yama ...................... 438/48 |
| 2008/0179988 A1 | 7/2008 | Jeong et al. |
| 2008/0237756 A1 * | 10/2008 | Partridge et al. ......... 257/415 |
| 2008/0238575 A1 * | 10/2008 | Tada et al. ............... 333/186 |
| 2009/0071807 A1 * | 3/2009 | Kominato et al. ........ 200/181 |
| 2009/0101383 A1 * | 4/2009 | Miyagi et al. ........... 174/50.5 |
| 2009/0134513 A1 * | 5/2009 | Qiu ......................... 257/734 |
| 2010/0308423 A1 * | 12/2010 | Shimooka ................ 257/415 |

* cited by examiner

MEMS DEVICE AND MANUFACTURING METHOD THEREOF

CROSS-REFERENCE TO RELATED APPLICATIONS

This application is based upon and claims the benefit of priority from the prior Japanese Patent Application No. 2009-135339, filed on Jun. 4, 2009; the entire contents of which are incorporated herein by reference.

BACKGROUND

Conventionally, as a microelectromechanical system (MEMS) device, there has been proposed a device having provided within an encapsulation structure made of an insulation film such as a nitride film, a first electrode extended in a first direction on a semiconductor substrate, second electrodes arranged at both sides of the first electrode in a second direction orthogonal to the first electrode at a predetermined distance from the first electrode, a pair of pillars made of a conductive material provided at an end of each second electrode at a side of the first electrode, and a beam formed with a belt-shaped conductive material connecting the pair of pillars (see, for example, U.S. Pat. No. 6,936,494).

However, when a lateral oscillation or shock is given from outside to the MEMS device with such an encapsulation structure, a movable element such as the beam arranged within the encapsulation structure varies greatly, and has a risk of being damaged.

SUMMARY

A MEMS device according to an embodiment of the present invention comprises: a movable element supported by a supporting member on a substrate; an encapsulation structure provided above the substrate so as to encapsulate the movable element; and a fin that is made of an insulation film, provided above the substrate, and provided inside of the encapsulation structure and outside of the movable element, and a part of the fin being positioned between a height from the substrate when the movable element are turned ON and a height from the substrate when the movable element are turned OFF.

A manufacturing method of a MEMS device according to an embodiment of the present invention comprises: forming a first sacrificial layer having substantially a trapezoidal cross-sectional surface vertical to a substrate surface, in a MEMS device forming region above a substrate; forming, along a predetermined direction, a first through-hole that pierces through the first sacrificial layer in a thickness direction; forming a movable element extended in the predetermined direction and supporting members that support the movable element above the substrate, by embedding the first through-hole and forming a metal film on the first sacrificial layer, and by patterning the metal film to include a forming position of the first through-hole; forming a first insulation film above the substrate on which the movable element is formed, so as to encapsulate the movable element; etching the first insulation film to arrange the insulation film at a predetermined distance from a side surface of the movable element; forming a second sacrificial layer having substantially a trapezoidal cross-sectional surface vertical to a substrate surface, to cover the first sacrificial layer on which the movable element is formed; forming a second insulation film above the substrate on which the second sacrificial layer is formed; forming a second through-hole on the second insulation film; removing the first and second sacrificial layers from the second through-hole; and forming an over-sealing layer that seals the second through-hole on the second insulation film.

A manufacturing method of a MEMS device according to an embodiment of the present invention comprises: forming a first sacrificial layer having substantially a trapezoidal cross-sectional surface vertical to a substrate surface, in a MEMS device forming region above a substrate; forming movable element extended in a predetermined direction on the first sacrificial layer; forming a first through-hole that pierces through the first sacrificial layer in a thickness direction, at a position other than a forming position of the movable element; forming a first insulation film above the substrate on which the movable element is formed so as to embed the first through-hole; etching the first insulation film to arrange the insulation film at a predetermined distance from a side surface of the movable element and to connect the forming position of the first through-hole to a part of the movable element; forming a second sacrificial layer having substantially a trapezoidal cross-sectional surface vertical to the substrate surface, to cover the first sacrificial layer on which the movable element are formed; forming a second insulation film above the substrate on which the second sacrificial layer is formed; forming a second through-hole on the second insulation film; removing the first and second sacrificial layers from the second through-hole; and forming an over-sealing layer that seals the second through-hole on the second insulation film.

DETAILED DESCRIPTION

Figure 1A:
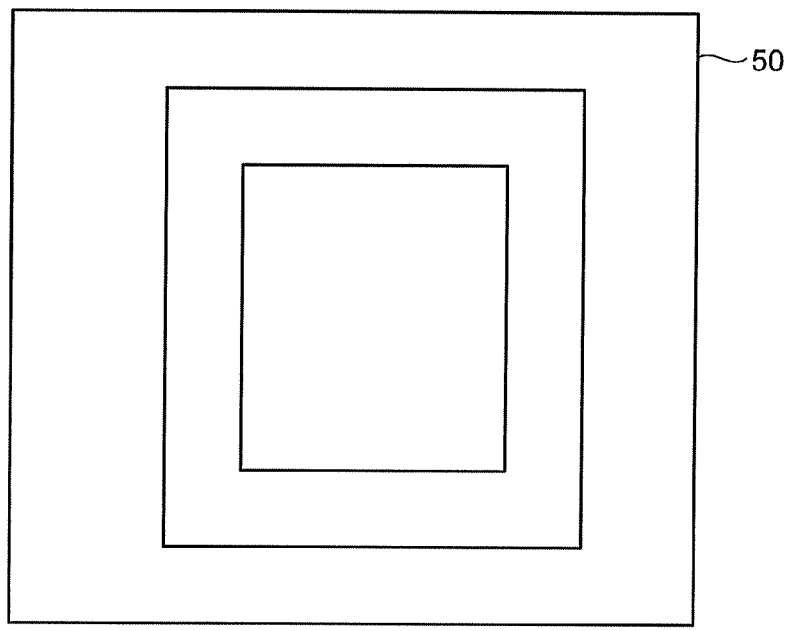
FIG. 1A is a schematic plan view of an example of a configuration of a MEMS device according to a first embodiment of the present invention.

Exemplary embodiments of a MEMS device and a manufacturing method thereof according to the present invention will be explained below in detail with reference to the accompanying drawings. The present invention is not limited to the embodiments. In addition, cross-sectional views of a MEMS device explained in the embodiments are schematic, and the relationship between a thickness and a width of a layer and a ratio of thickness of each layer shown in the drawings are different from actual products. Furthermore, film thicknesses described below are only exemplary and the present invention is not limited thereto.

Figure 1B:
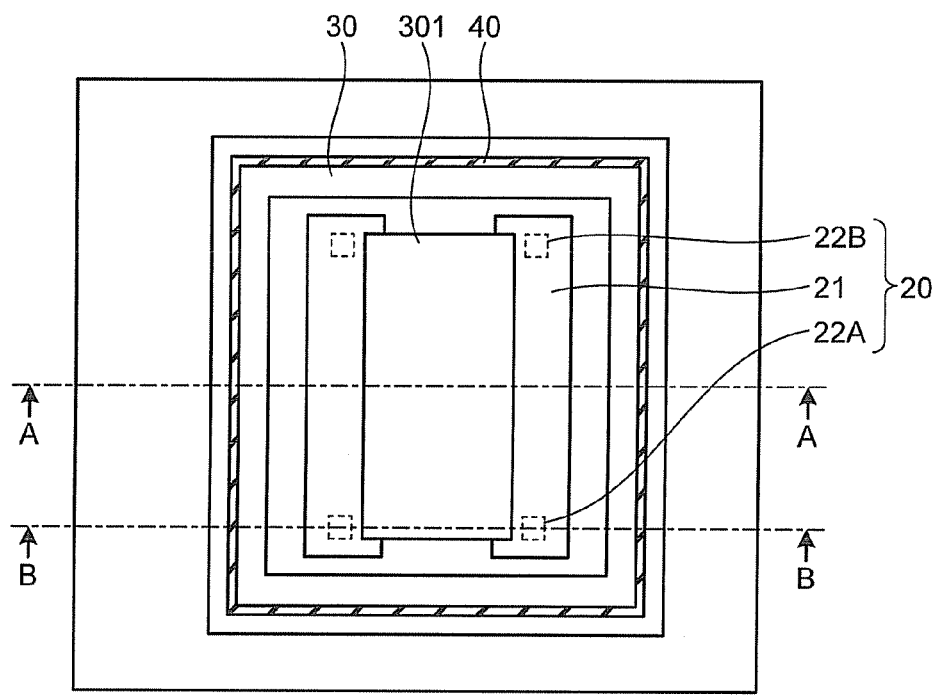
FIG. 1B is a schematic plan view of an example of a configuration within a thin-film encapsulation structure.
Figure 2A:
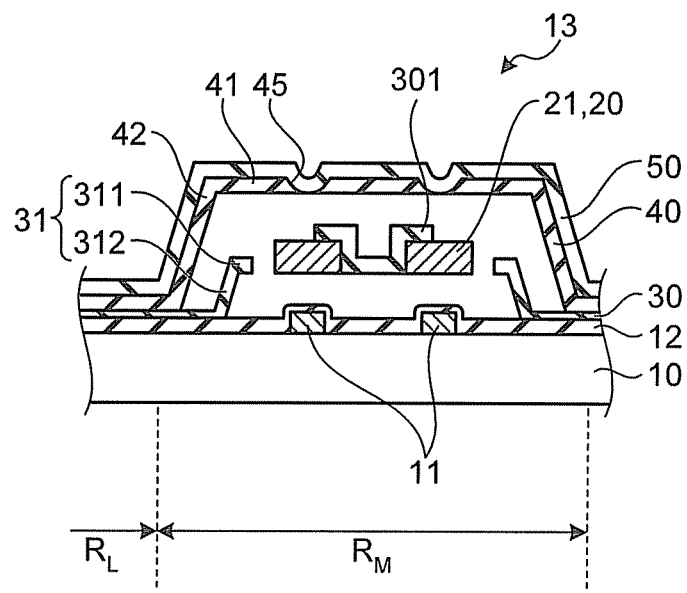
FIG. 2A is a cross-sectional view corresponding to an A-A cross section in FIG. 1B.
Figure 2B:
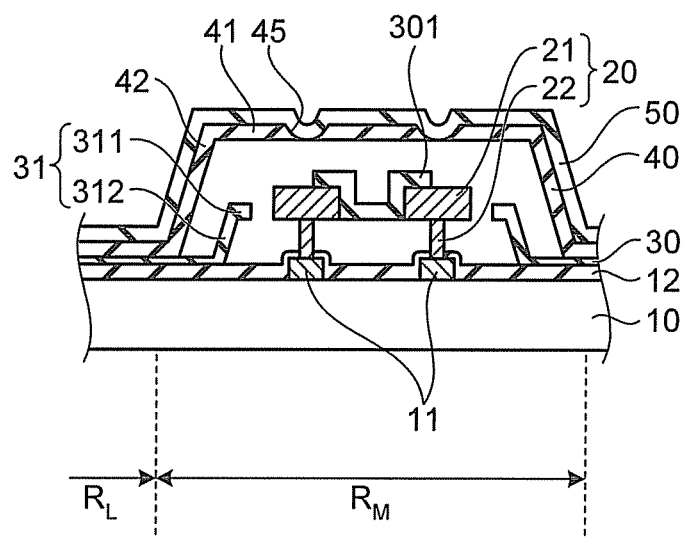
FIG. 2B is a cross-sectional view corresponding to a B-B cross section in FIG. 1B.

FIG. 1A is a schematic plan view of an example of a configuration of a MEMS device according to a first embodiment of the present invention, and FIG. 1B is a schematic plan view of an example of a configuration within a thin-film encapsulation structure. FIG. 2A is a cross-sectional view corresponding to an A-A cross section in FIG. 1B, and FIG. 2B is a cross-sectional view corresponding to a B-B cross section in FIG. 1B.

A substrate 10 such as a semiconductor substrate and a dielectric substrate has a MEMS forming region $R_M$ in which a MEMS 13 is formed, and a wiring forming region $R_L$ in which a wiring other than that in the MEMS 13 is formed. The above drawings depict only the MEMS forming region $R_M$ and the wiring forming region $R_L$ at a periphery of the MEMS forming region $R_M$, and these regions are explained below.

Wiring layers 11 to drive the MEMS 13, having a thickness of several hundred nanometers to several micrometers made of a material such as aluminum are patterned at a predetermined position on the substrate 10. A passivation film 12 having a thickness of several hundred nanometers to several micrometers made of a silicon oxide film (an SiO film) or a silicon nitride film (an SiN film) is formed on substantially the entire surface of the substrate 10 on which the wiring layers 11 are formed.

A first insulation film 30 and a second insulation film 40 are laminated on the passivation film 12 of the wiring forming region $R_L$. The first insulation film 30 is configured by a silicon oxide film or a silicon nitride film in a thickness of several hundred nanometers to several micrometers, for example. The second insulation film 40 is configured by a silicon nitride film or a silicon oxide film in a thickness of several hundred nanometers to several micrometers, for example. When the first insulation film 30 is a silicon oxide film, the second insulation film 40 is preferably a silicon nitride film. When the first insulation film 30 is a silicon nitride film, the second insulation film 40 is preferably a silicon oxide film. Although not shown, in the wiring forming region $R_L$, an opening is provided in a laminated film made of the passivation film 12 and the first and second insulation films 30 and 40 to expose a part of a wiring. This wiring is connected to an external wiring at this portion.

A MEMS movable element 20 is formed on the passivation film 12 of the MEMS forming region $R_M$. A thin-film encapsulation structure is formed with the second insulation film 40 and an over-sealing layer 50 to cover the surroundings of the MEMS movable element 20. Specifically, the MEMS movable element 20 includes two oscillators 21 extended in the second direction orthogonal to the first direction at a predetermined height from an upper surface of the passivation film 12, and anchors 22 (22A and 22B) as supporting members that support the oscillators 21, at a predetermined interval in the first direction. In this example, two anchors 22a and 22B are provided for one oscillator 21, and a lower part of the anchor 22A is connected to the wiring layers 11 formed in the MEMS forming region $R_M$. Because the anchor 22A is connected to the wiring layers 11 in this way, the anchors 22A and 22B are preferably configured by a conductive material. In this example, the two oscillators 21 are connected to each other with a connecting member 301 made of the first insulation film 30. In FIG. 1B, the anchors 22A and 22B are arranged at both ends of each of the oscillators 21 in the second direction of the oscillator 21 near substantially a center in the first direction. However, the positions of the anchors 22A and 22B are not limited to these positions. For example, the anchors 22A and 22B can be provided at both ends of each oscillator in the second direction opposite to a connecting position of the first insulation film 30 in the first direction.

The second insulation film 40 has an encapsulation structure that covers the MEMS movable element 20, and has an upper surface 41 substantially parallel with a substrate surface, and a side surface 42 that connects the upper surface 41 and the substrate surface. With this arrangement, a region surrounded by the second insulation film 40 and the substrate 10 has a hollow structure.

Within a region surrounded by the second insulation film 40, the first insulation film 30 extended from the wiring forming region $R_L$ functions as a stopper that stops a large displacement of the oscillators 21 in the first direction. That is, the first insulation film 30 constitutes a fin 31 formed within a vertically movable region of the oscillators 21, at a predetermined distance from a side surface of the oscillators 21. In the example of FIG. 1A to FIG. 2B, the fin 31 has an upper surface 311 formed in a direction parallel with the substrate surface and a side surface 312 that connects the upper surface 311 and the substrate 10.

A sacrificial-layer removing through-hole 45 that pierces through the second insulation film 40 is formed on the upper surface 41 of the second insulation film 40. The over-sealing layer 50 is provided on the upper surface of the second insulation film 40 to seal the sacrificial-layer removing through-hole 45. The over-sealing layer 50 is formed with an organic material film of polyimide and the like or an insulation film such as a silicon oxide film and a silicon nitride film. The second insulation film 40 and the over-sealing layer 50 function as an encapsulation structure that covers the MEMS movable element 20.

In the MEMS device having the configuration described above, assuming that a state where the MEMS movable element 20 (the oscillators 21) is located at an upper position is OFF and a state where the element is located at a lower position is ON, the MEMS movable element 20 oscillates in a vertical direction (a direction vertical to both the first and second directions, that is, a height direction), by switching an input of a signal to the MEMS movable element 20.

When a thin-film encapsulation structure is not in vacuum but is sealed with a gas, and also when the fin 31 of the first insulation film 30 is not formed, the oscillators 21 oscillate in a vertical direction for a while even after a signal to the MEMS movable element 20 is set to OFF. However, in the first embodiment, because the fin 31 configured by the first insulation film 30 is present to cover the surroundings of the MEMS movable element 20, the fin 31 suppresses a movement (shifting) of the gas present in a space formed by the first insulation film 30 and the MEMS movable element 20. As a result, after the signal is set to OFF, a residual oscillation of the oscillators 21 can be suppressed faster than that when the fin 31 of the first insulation film 30 is not present.

Each of the oscillators 21 is greatly displaced to the first direction when an oscillation (a lateral oscillation) or shock is given to the first direction in the MEMS device. However, the presence of the fin 31 of the first insulation film 30 suppresses unnecessary displacement of the oscillator 21 to the first direction.

Because the anchor 22 is formed in the oscillator 21 along the second direction, the oscillator 21 is not largely displaced to the second direction as compared to the displacement to the first direction. Therefore, the fin 31 of the first insulation film 30 is not required to be provided at the end of the MEMS device in the second direction.

Figure 3:
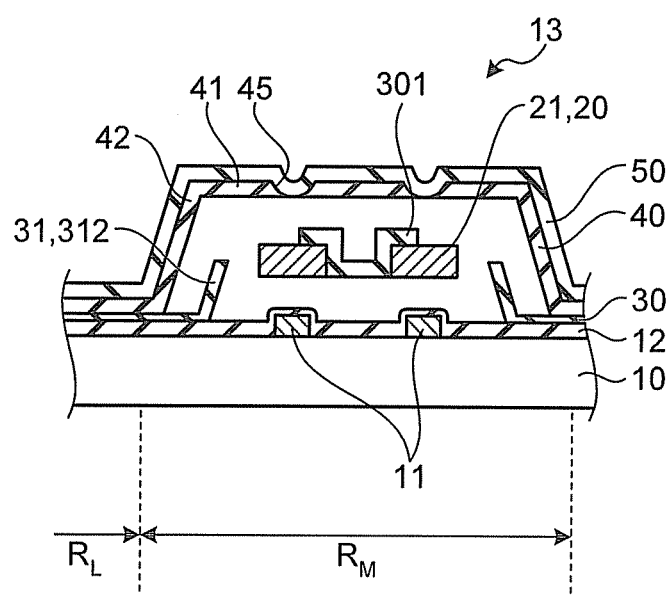
FIG. 3 is a schematic cross-sectional view of another example of a configuration of the MEMS device.

In the example of FIG. 1A to FIG. 2B, although the fin 31 has the upper surface 311 formed in a direction parallel with the substrate surface and the side surface 312 that connects the upper surface 311 and the substrate 10, the configuration of the fin 31 is not limited to this. FIG. 3 is a schematic cross-sectional view of another example of a configuration of the MEMS device. In FIG. 3, constituent elements identical to those in FIGS. 2A and 2B are denoted by like reference numerals.

In FIG. 3, the fin 31 of the first insulation film 30 is provided within an encapsulation structure configured by the second insulation film 40 and the over-sealing layer 50. However, the fin 31 is not formed on the upper surface 311 formed in a direction parallel with the substrate surface in FIGS. 2A and 2B, but is configured by only the side surface 312. This side surface 312 is formed within a vertical movable range of the oscillators 21. The fin 31 in this configuration can also suppress unnecessary displacement of the oscillators 21 in the first direction described above.

Figure 4A:
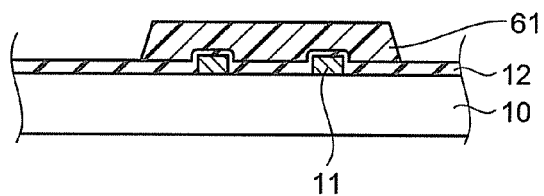
FIG. 4A to FIG. 4L are schematic cross-sectional views of an example of a procedure of a manufacturing method of a MEMS device according to the first embodiment.
Figure 4B:
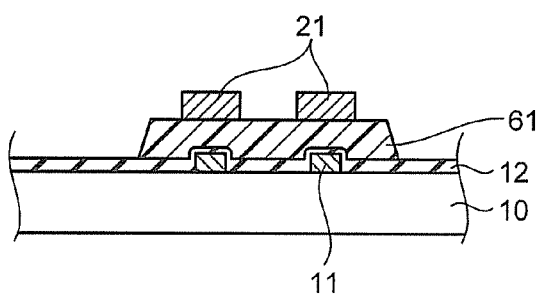

A manufacturing method of a MEMS device having the above configuration is explained next. FIG. 4A to FIG. 5 are schematic cross-sectional views of an example of a procedure of the manufacturing method of the MEMS device according to the first embodiment. FIGS. 4A to 4L are cross-sectional views corresponding to the A-A cross section in FIG. 1A, and FIG. 5 is a cross-sectional view corresponding to the B-B cross section in FIG. 1B.

First, a metal film of aluminum or the like is formed in a thickness of several hundred nanometers to several micrometers on the substrate 10. The metal film is patterned in a predetermined shape to form the wiring layers 11 by lithography and etching. The passivation film 12 of a silicon oxide film, a silicon nitride film or the like is formed on the substrate 10 on which the wiring layers 11 are formed, by the chemical vapor deposition (CVD) method or the like. The passivation film 12 has a thickness of several hundred nanometers to several micrometers. A first sacrificial layer 61 is formed on the MEMS forming region $R_M$ by patterning an organic material such as polyimide to have a trapezoidal cross-sectional shape on the passivation film 12 (FIG. 4A). The first sacrificial layer 61 is formed by coating polyimide in a film on a target portion and then applying photosensitive patterning, or by exposing and developing in a predetermined shape by lithography and etching using a dry etching method. The first sacrificial layer 61 has a thickness of several hundred nanometers to several micrometers. As shown in FIG. 5, at least two through-holes 62 are formed in one oscillator 21 to pierce through the first sacrificial layer 61 in a thickness direction, at a portion where the oscillator 21 of the first sacrificial layer 61 is formed. One of the through-holes 62 pierces through the passivation film 12, and an upper surface of the wiring layer 11 of a lower layer becomes exposed.

A metal film of aluminum or the like is then formed on the passivation film 12 on which the first sacrificial layer 61 is formed, by a film forming method such as a sputtering method. A metal film is also formed and embedded into the through-holes 62. Thereafter, the metal film is processed by lithography and etching to form the oscillators 21 of the MEMS movable element 20 extended in the second direction at a predetermined interval in the first direction (FIG. 4B). Each oscillator has a thickness of several hundred nanometers to several micrometers. The metal film formed in the through-holes 62 becomes the anchor 22 of the MEMS movable element 20.

Figure 4C:
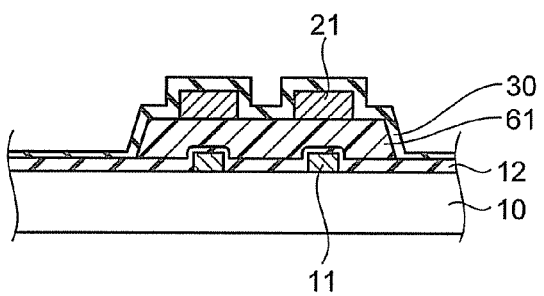
Figure 5:
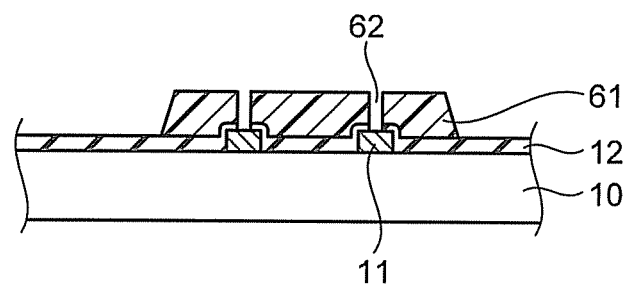
FIG. 5 is a schematic cross-sectional view of another example of a procedure of the manufacturing method of a MEMS device according to the first embodiment.

Thereafter, the first insulation film 30 is formed on the passivation film 12 and on the first sacrificial layer 61 on which the oscillators 21 are formed, by a film forming method such as the CVD method (FIG. 4C). The first insulation film 30 including a silicon oxide film or a silicon nitride film is formed in a thickness of several hundred nanometers to several micrometers. Consequently, the first insulation film 30 is formed to cover an upper surface of the wiring forming region $R_L$ and exposed surfaces of the first sacrificial layer 61 and the oscillators 21 in the MEMS forming region $R_M$.

Figure 4D:
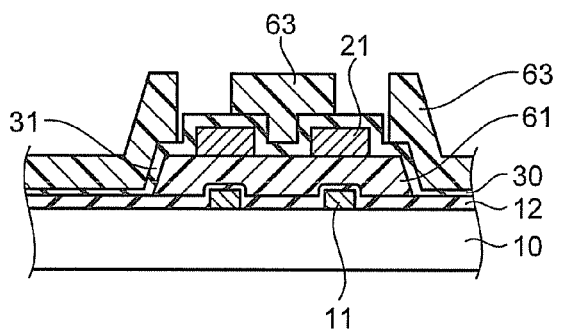

Next, a resist is coated on the first insulation film 30, and is exposed and developed by lithography, thereby forming a resist pattern 63 in a predetermined shape (FIG. 4D). An upper surface and an external side surface of the oscillators 21 are exposed by patterning. The external side surfaces of the oscillators 21 are side surfaces of the oscillators 21 in the first direction facing the side surface 42 of the second insulation film 40 constituting a thin-film encapsulation structure. The resist pattern 63 is formed to provide a predetermined distance between the external side surface of each of the oscillators 21 and the first insulation film 30, by a subsequent etching process. Preferably, the patterning is performed such that an end of an opening of the resist pattern 63 formed in the MEMS forming region $R_M$ is positioned above a side surface (a side surface 312 of the first insulation film 30) on the first sacrificial layer 61. This is because when the end of the opening of the resist pattern 63 formed in the MEMS forming region $R_M$ is positioned on the substrate 10 due to the influence of deviated superimposition of an exposure pattern, for example, a portion of a small opening is more deeply etched than a portion of a large opening in a subsequent etching process of the first insulation film 30, and this has a high risk of etching the passivation film 12 and the wiring layers 11 therebelow, as well as the substrate 10, in addition to the first insulation film 30 exposed on the substrate 10.

Figure 4E:
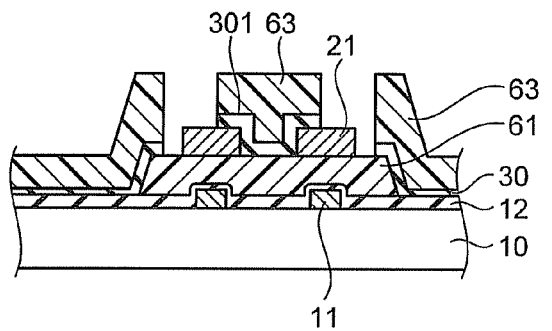
Figure 4F:
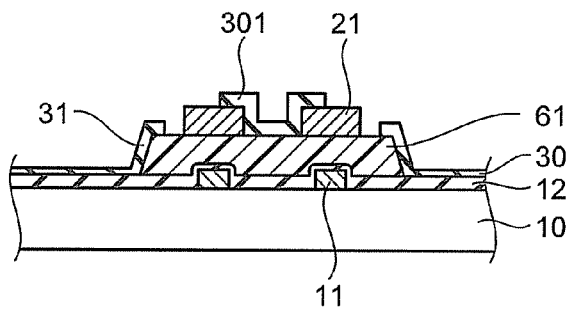

Thereafter, the first insulation film 30 is etched using the resist pattern 63 as a mask by reactive ion etching (RIE) or by wet etching (FIG. 4E). Consequently, the upper surface and the external side surface of the oscillators 21, and a part of an upper surface of the first sacrificial layer 61 are exposed. The first insulation film 30 formed on a side surface of the first sacrificial layer 61 becomes the fin 31, and the first insulation film 30 that connects the two oscillators 21 becomes the connecting member 301. The resist pattern is removed by ashing using an $O_2$ gas or by a process using chemicals (FIG. 4F). When the first insulation film 30 is etched, a risk of etching the substrate 10 beneath the passivation film 12 or the wiring layers 11 can be reduced even when the etching is locally progressed, because the passivation film 12 and the first insulation film 30 are laminated on the substrate 10. The first insulation film 30 can be also etched so as not to provide the fin 31 of the first insulation film 30 at an end in the second direction, because the anchors 22 are formed on the oscillators 21 along the second direction.

Figure 4G:
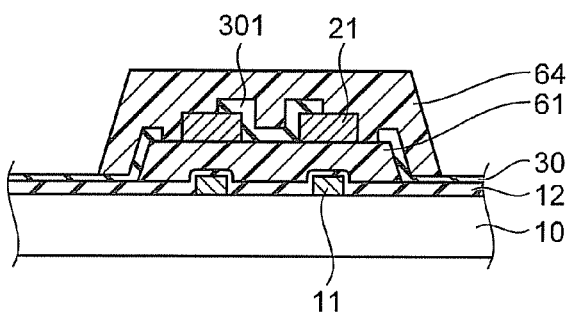

A second sacrificial layer 64 is then formed by patterning an organic material such as polyimide such that the cross section of this layer has a trapezoidal shape to cover the first sacrificial layer 61 (FIG. 4G). The second sacrificial layer 64 is formed by coating polyimide in a film on a target portion and then applying photosensitive patterning, or by exposing and developing in a predetermined shape by lithography and by dry etching. The second sacrificial layer 64 has a thickness of several hundred nanometers to several micrometers.

Figure 4H:
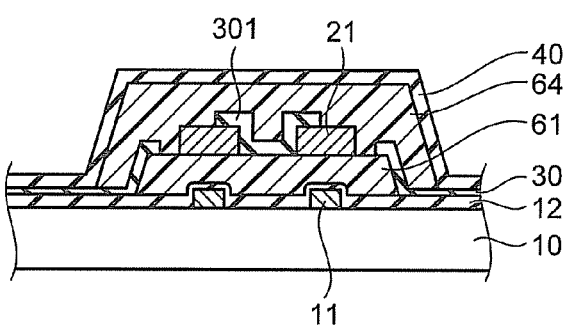

Thereafter, the second insulation film 40 is formed on the first insulation film 30 and on the second sacrificial layer 64 by a film forming method such as the CVD method (FIG. 4H). The second insulation film 40 includes a silicon nitride film or a silicon oxide film, and is formed in a thickness of several hundred nanometers to several micrometers. With this arrangement, the second insulation film 40 is formed to cover the upper surface of the wiring forming region $R_L$, and the second sacrificial layer 64 in the MEMS forming region $R_M$.

Figure 4I:
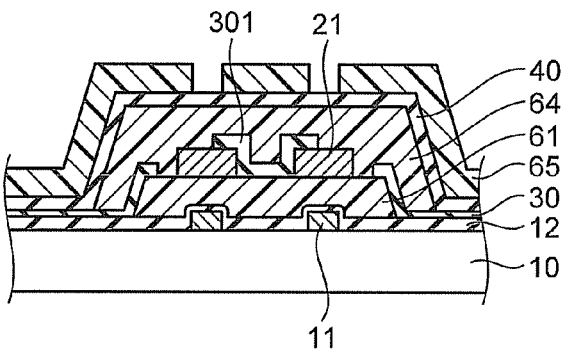
Figure 4J:
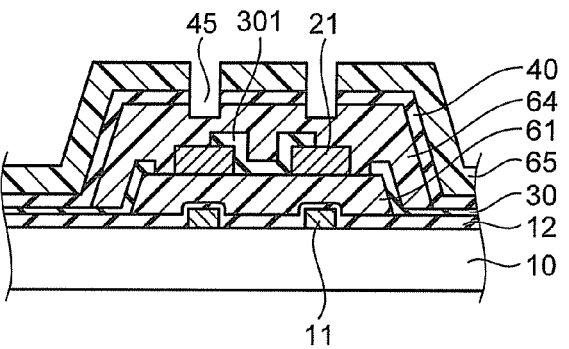

Next, the resist is coated on the second insulation film 40, and is exposed and developed by lithography, thereby forming the resist pattern 65 in a predetermined shape (FIG. 4I). The resist pattern 65 is used to form the sacrificial-layer removing through-hole 45 in the second insulation film 40. The second insulation film 40 is etched by RIE and by wet etching using the resist pattern 65 as a mask (FIG. 4J). A part of the second sacrificial layer 64 can be etched. As a result, the sacrificial-layer removing through-hole 45 is formed to pierce through the second insulation film 40 in a thickness direction.

Figure 4K:
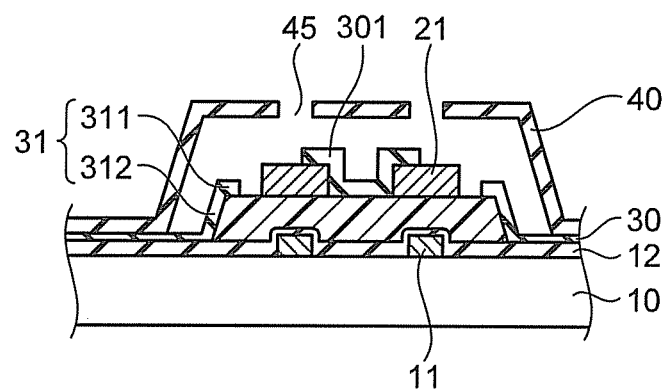

Thereafter, the resist pattern 65 formed on the second insulation film 40, and the first and second sacrificial layers 64 and 61 are then removed by ashing using an $O_2$ gas or the like (FIG. 4K). The second sacrificial layer 64 is ashed by an $O_2$ gas introduced via the sacrificial-layer removing through-hole 45. The second sacrificial layer 64 formed on a surface higher than the first sacrificial layer 61 is ashed. The first sacrificial layer 61 is ashed by an $O_2$ gas introduced via a gap between an end of the first insulation film 30 on the first sacrificial layer 61 and the oscillator 21. As a result, inside of the second insulation film 40 becomes hollow. The first sacrificial layer 61 formed around the MEMS movable element 20 is removed. An end of the fin 31 made of the first insulation film 30 is formed at a predetermined distance from the side surface of the MEMS movable element 20 in the first direction. In an example of FIG. 4K, the fin 31 is formed to have the upper surface 311 parallel with the substrate surface, and the side surface 312 that connects the upper surface 311 and the substrate 10.

Figure 4L:
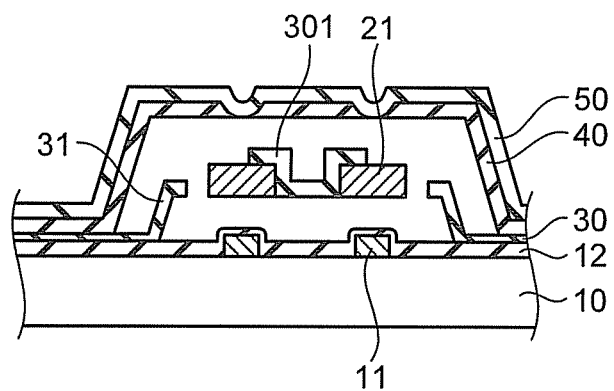

The over-sealing layer 50 is then formed on the second insulation film 40 to seal the sacrificial-layer removing through-hole 45 formed on the second insulation film 40 (FIG. 4L). The over-sealing layer 50 is formed by coating polyimide in a film, or by forming an insulation film of a silicon oxide film or a silicon nitride film by the CVD method. As a result, a hollow portion is sealed, a thin-film encapsulation structure is completed in the MEMS forming region $R_M$, and the manufacturing method of the MEMS device is finished.

According to the first embodiment, the fin 31 made of the first insulation film 30 is provided at a height of a movable range of the oscillators 21 at an on-time and an off-time, at a predetermined distance from the oscillators 21 of the MEMS movable element 20 of a thin-film encapsulation structure formed with the second insulation film 40. Accordingly, when an oscillation (fluctuation) in a lateral direction of the MEMS device occurs, a movement of the oscillators 21 greatly oscillating in excess of a normal movable range is suppressed. As a result, the oscillators 21 can be prevented from being damaged, and thus the reliability of a movable portion of a mobile product can be improved in using the MEMS device in the mobile product.

When the first insulation film 30 constituting the fin 31 is formed around the oscillators 21 in the thin-film encapsulation structure, a movement of a gas within a space surrounded by the first insulation film 30 and the MEMS movable element 20 can be suppressed. Therefore, residual oscillation of the oscillators 21 when a signal is set to OFF can be quickly converged.

Furthermore, in forming the resist pattern 63 to etch the first insulation film 30, the end of the opening of the resist pattern 63 is preferably on the first sacrificial layer 61. However, the end of the opening of the resist pattern 63 is sometimes deviated onto the substrate 10 where the first sacrificial layer 31 is not formed, due to a deviation at an exposure time. In this case, a risk of etching the substrate 10 beneath the passivation film 12 or the wiring layers 11 can be reduced, because the passivation film 12 and the first insulation film 30 are present on the substrate 10.

Further, adhesiveness between the second insulation film 40 having a thin-film encapsulation structure and the passivation film 12 or the substrate 10 is sometimes poor. In the case of poor adhesiveness, close adhesion between the second insulation film 40 and the substrate 10 can be increased by selecting a material that increases adhesiveness of the first insulation film 30 between the second insulation film 40 and the substrate 10, because the first insulation film 30 and the second insulation film 40 are laminated in the wiring forming region $R_L$ as well as in the MEMS forming region $R_M$. Stress generated due to formation of the second insulation film 40 on the substrate 10 can be suppressed by forming the first insulation film 30 between the second insulation film 40 and the substrate 10.

Figure 6:
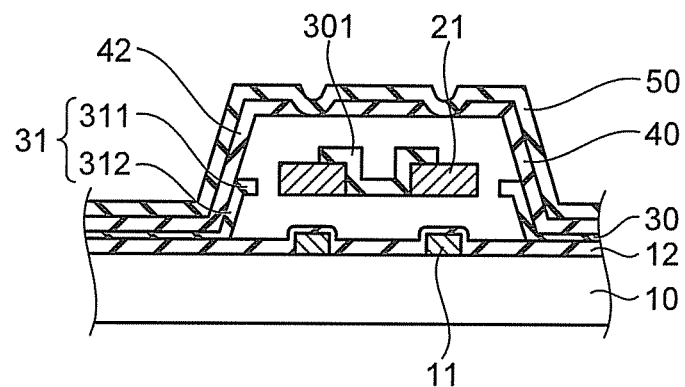
FIG. 6 is a schematic cross-sectional view of an example of a configuration of a MEMS device according to a second embodiment of the present invention.

FIG. 6 is a schematic cross-sectional view of an example of a configuration of a MEMS device according to a second embodiment of the present invention. As shown in FIG. 6, the side surface 312 of the fin 31 configured by the first insulation film 30 in the thin-film encapsulation structure in the first embodiment is contacted to the side surface 42 of the second insulation film 40 to configure the MEMS device of the second embodiment. Other configurations of the second embodiment are identical to those explained in the first embodiment, and thus explanations thereof will be omitted. A manufacturing method of a MEMS device having the configuration of the second embodiment is identical to that explained in the first embodiment, except that the second sacrificial layer 64 is not formed on the side surface of the first insulation film but is formed on only the upper surface of the first insulation film. Therefore, redundant explanations of the manufacturing method will be omitted. In the second embodiment, the fin 31 can have the configuration as shown in FIG. 3.

According to the second embodiment, the side surface 312 of the fin 31 configured by the first insulation film 30 in the thin-film encapsulation structure is formed in close adhesion to the side surface 42 of the second insulation film 40 forming the thin-film encapsulation structure. Therefore, in the second embodiment, intensity of the side surface of the thin-film encapsulation structure can be increased, in addition to effects obtained in the first embodiment. Because there is no distance between the first insulation film 30 and the side surface of the second insulation film 40, the area of the MEMS 13 can be reduced.

Figure 7:
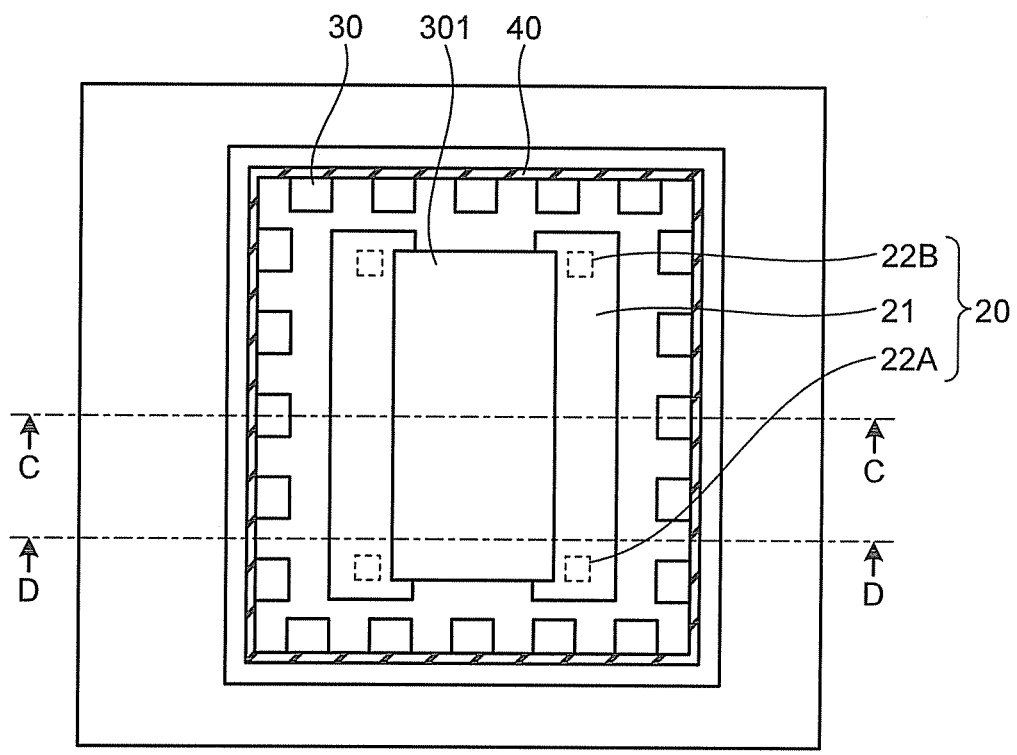
FIG. 7 is a schematic plan view of an example of a configuration of a MEMS device according to a third embodiment of the present invention.
Figure 8A:
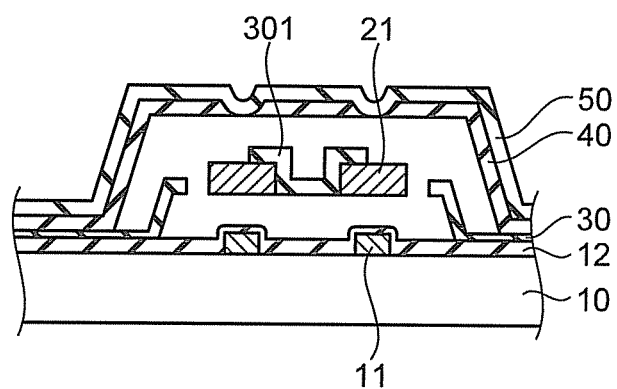
FIG. 8A is a cross-sectional view corresponding to a C-C cross section in FIG. 7.
Figure 8B:
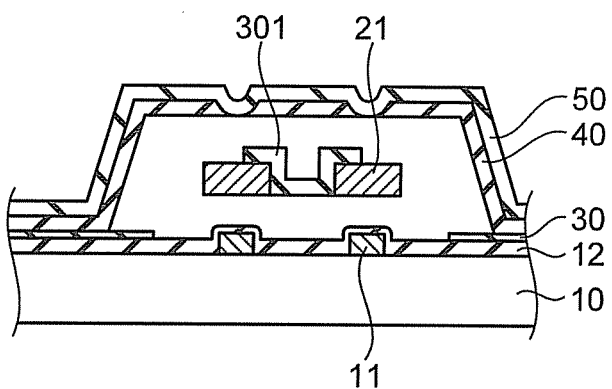
FIG. 8B is a cross-sectional view corresponding to a D-D cross section in FIG. 7.

FIG. 7 is a schematic plan view of an example of a configuration of a MEMS device according to a third embodiment of the present invention, FIG. 8A is a cross-sectional view corresponding to a C-C cross section in FIG. 7, and FIG. 8B is a cross-sectional view corresponding to a D-D cross section in FIG. 7. The MEMS device is configured such that the fin 31 of the first insulation film 30 is formed in a frilled shape.

For example, in the configuration of the MEMS device on a line C-C in FIG. 7, the cross section of the MEMS device is identical to that of the first embodiment, as shown in FIG. 8A. That is, at this portion, the MEMS device includes the fin 31 having the upper surface 311 of the first insulation film 30 and the side surface 312 that supports the upper surface 311.

On the other hand, in the configuration of the MEMS device on a line D-D in FIG. 7, the cross section of this device is different from that in the first embodiment, and the fin 31 of the first insulation film 30 is not formed, as shown in FIG. 8B.

As described above, according to the MEMS device of the third embodiment, the fins 31 formed with the first insulation film 30 having a length smaller than each side of the thin-film encapsulation structure are formed at a predetermined interval along sides of the thin-film encapsulation structure.

In the above explanations, a positional relationship between the side surface 312 of the first insulation film 30 and the side surface 42 of the second insulation film 40 has been exemplified. Alternatively, a positional relationship between the side surface 312 of the first insulation film 30 and the side surface 42 of the second insulation film 40 can be also applied to the second embodiment. The fins 31 of the third embodiment can also have a configuration identical to that shown in FIG. 3. A manufacturing method of the MEMS device having the configuration of the third embodiment is identical to that explained in the first embodiment, except that the first insulation film 30 is formed in a frilled shape. Therefore, redundant explanations of the manufacturing method will be omitted.

According to the third embodiment, when a lateral oscillation occurs, an area in which the oscillators 21 are contacted to the fins 31 by oscillating in excess of a normal movable range when stopped by the fins 31 can be made small. This effect is obtained in addition to effects obtained in the first embodiment.

In the first to third embodiments, the MEMS movable element has two oscillators provided in parallel. Alternatively, the MEMS movable element can have one oscillator or three or more oscillators arranged in parallel. In a fourth embodiment of the present invention, another example of a MEMS movable element arranged in a thin-film encapsulation structure is explained.

Figure 9A:
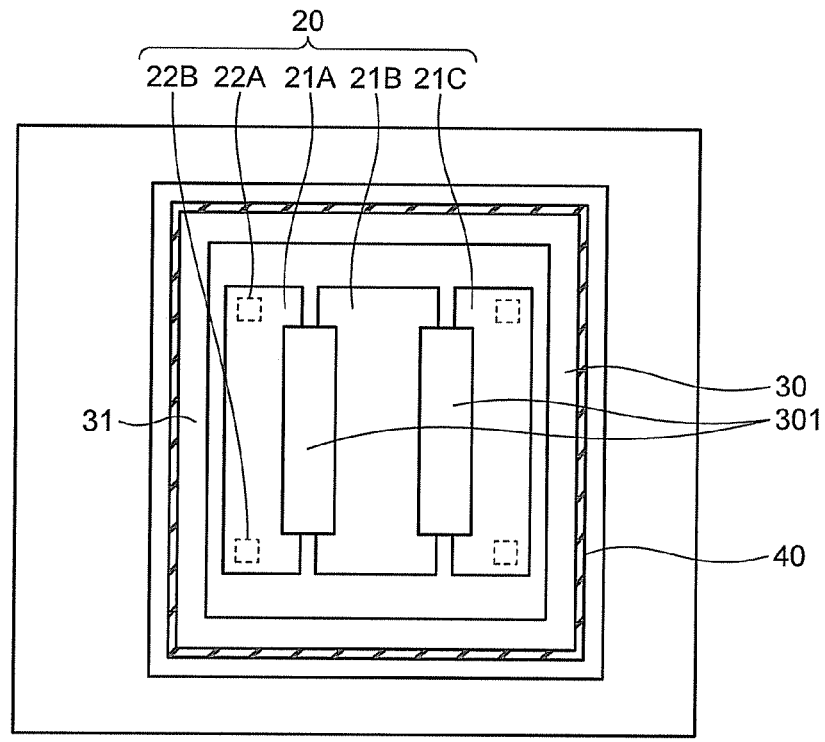
FIG. 9A and FIG. 9B are schematic plan views of an example of a configuration of a MEMS device according to a fourth embodiment of the present invention.
Figure 9B:
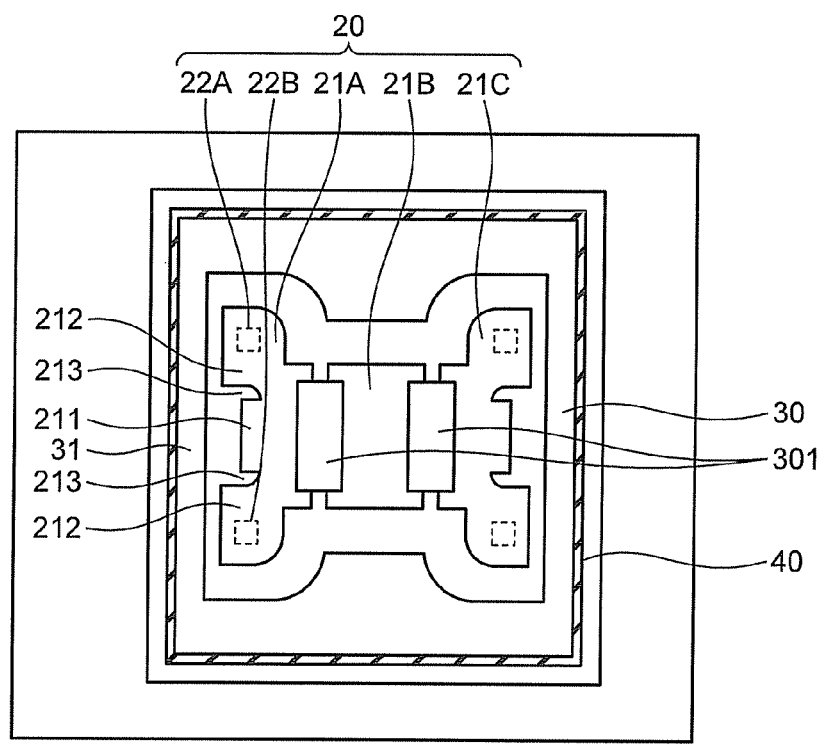

FIG. 9A and FIG. 9B are schematic plan views of an example of a configuration of a MEMS device according to the fourth embodiment. As shown in FIGS. 9A and 9B, the MEMS movable element 20 includes three oscillators 21A to 21C extended in the second direction at a predetermined height from the upper surface of the passivation film 12, and arranged in parallel with each other at a predetermined interval in the first direction, and the anchors 22 (22A and 22B) as supporting members that support two oscillators 21A and 21C arranged at outside of the oscillators in the first direction. A lower part of one anchor 22A provided in the oscillators 21A and 21C is connected to a wiring layer (not shown) formed in the MEMS forming region $R_M$. The oscillators 21A and 21B are connected to each other by the connecting member 301 made of the first insulation film 30, and the oscillators 21B and 21C are also connected to each other by the connecting member 301. Although not shown, a signal line is provided in the oscillator 21B at a center.

In FIG. 9A, each of the oscillators 21A to 21C has a rectangular shape. Therefore, the fin 31 of the first insulation film 30 constituting a thin-film encapsulation structure has a shape identical to that in the first embodiment.

In FIG. 9B, the oscillator 21B has a rectangular shape, and the oscillators 21A and 21C have a substantially E shape. Specifically, the oscillators 21A and 21C have a rectangular portion 211 having substantially the same length as the length of the oscillator 21B in the second direction, and a stretched portion 212 provided in stretch to outside of a layout position of the oscillator 21B in the second direction. The anchors 22A and 22B are provided in the stretched portion 212. Notches 213 are provided between the rectangular portion 211 and the stretched portion 212.

As described above, the length of the MEMS movable element 20 in the second direction is large in the oscillators 21A and 21C, and is small in the oscillator 21B. The MEMS movable element 20 has a slender outline near the center in the first direction. Therefore, the fin 31 of the first insulation film 30 constituting the thin-film encapsulation structure is formed to match the outline of the MEMS movable element 20. That is, the fin 31 is formed to have a predetermined interval between the fin 31 and ends of the oscillators 21A to 21C. Consequently, on a side parallel with the first direction, the first insulation film 30 has a shape stretched in a center direction of the thin-film encapsulation structure, near a forming position of the oscillator 21B.

As shown in FIGS. 9A and 9B, when the MEMS movable element 20 is configured by three oscillators 21, the oscillators 21A to 21C are electrically insulated. Therefore, a driving power source can be connected to the oscillators 21A and 21C arranged at both sides, and a signal line can be connected to the oscillator 21B arranged at the center. That is, electrodes for driving and an electrode for a signal can be arranged independently. As a result, the oscillator 21B can have a configuration tolerant to the noise flowing to driving electrodes (the anchors 22A and 22B).

In FIGS. 9A and 9B, as the fin 31 of the thin-film encapsulation structure of the fourth embodiment, a case of applying the configuration of the first embodiment has been explained. Alternatively, the fourth embodiment can apply the configuration of the second embodiment or the third embodiment.

According to the fourth embodiment, because the oscillators are divided into the oscillators 21A and 21C for driving electrodes and the oscillator 21B for a signal electrode, the oscillator 21B for a signal electrode can avoid being influenced by the noise flowing through the anchors 22A and 22B at outside.

Figure 10:
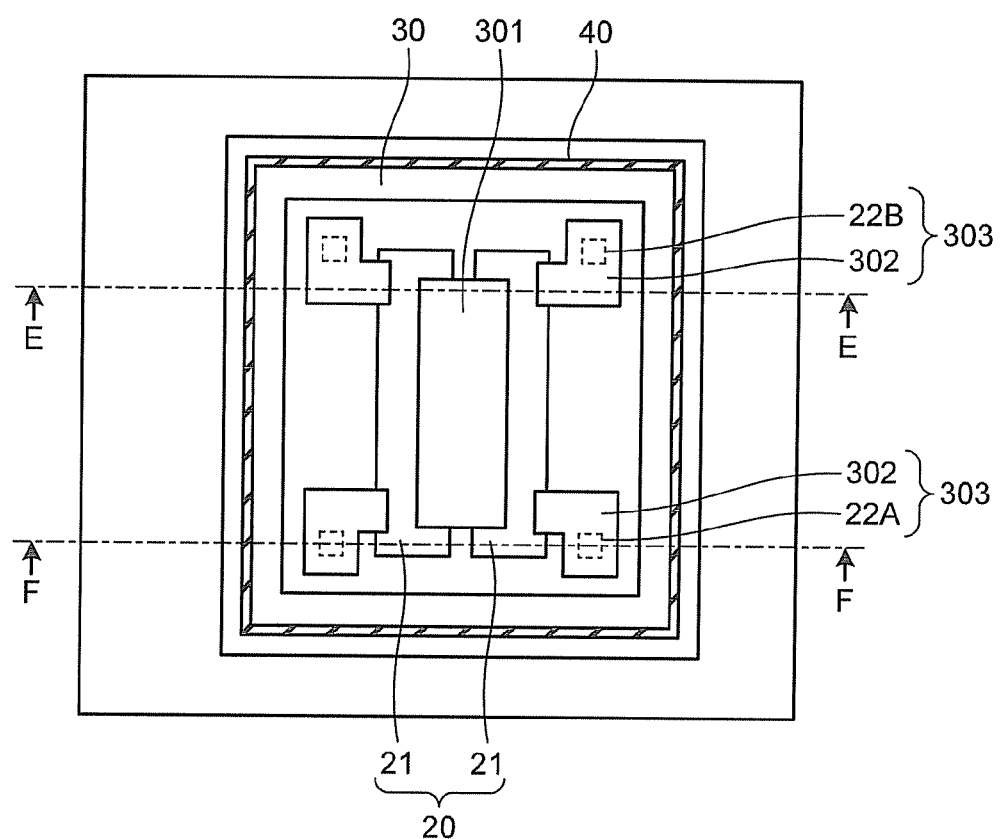
FIG. 10 is a schematic plan view of an example of a configuration of a MEMS device according to a fifth embodiment of the present invention.
Figure 11A:
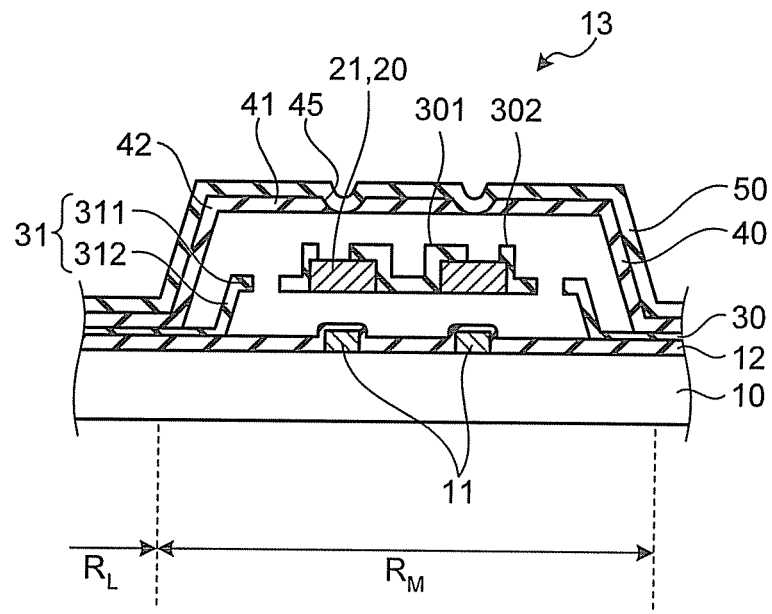
FIG. 11A is a cross-sectional view along a line E-E in FIG. 10.
Figure 11B:
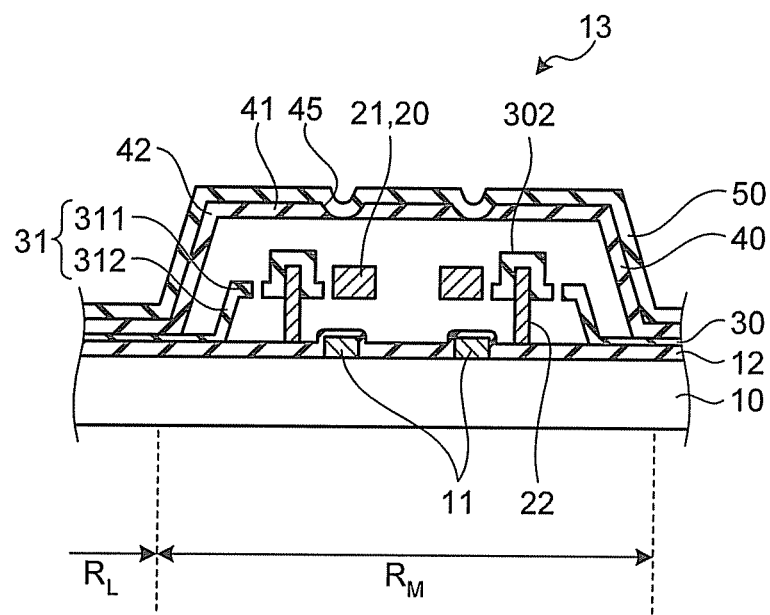
FIG. 11B is a cross-sectional view along a line F-F in FIG. 10.

FIG. 10 is a schematic plan view of an example of a configuration of a MEMS device according to a fifth embodiment of the present invention, and is a schematic plan view of an example of a configuration within a thin-film encapsulation structure. FIG. 11A is a cross-sectional view along a line E-E in FIG. 10, and FIG. 11B is a cross-sectional view along a line F-F in FIG. 10.

In the fifth embodiment, the thin-film encapsulation structure is identical to that of the first embodiment, and the MEMS movable element 20 has a different configuration from that in the first embodiment. Specifically, the MEMS movable element 20 has a configuration that two oscillators 21 extended in the second direction at a predetermined height from the upper surface of the passivation film 12 are arranged at a predetermined interval in the first direction. Each MEMS movable element 20 is supported by supporting units 303 formed on the passivation film 12. The two movable elements 21 are connected to each other by the connecting member 301 made of the first insulation film 30. The supporting units 303 include the anchors 22A and 22B formed substantially vertically on the passivation film 12, and holding members 302 provided at upper ends of the anchors 22A and 2B and holding the oscillators 21. Lower ends of the anchors 22A and 22B do not need to be connected to the wiring layers 11. Therefore, the anchors 22A and 22B and the holding members 302 can be configured by conductive materials, or can be configured by insulation materials. In the fifth embodiment, the anchors 22A and 22B are configured by the same conductive material as that of the oscillator 21, and the holding members 302 are configured by the first insulation film 30. Constituent elements of the fifth embodiment identical to those of the first embodiment are denoted by like reference numerals, and explanations thereof will be omitted.

A manufacturing method of the MEMS device having the above configuration is the same as that explained with reference to FIG. 4A to FIG. 5 in the first embodiment, except the following procedure. In FIG. 5, all the through-holes 62 are provided to expose the passivation film 12. In FIG. 4D, the resist pattern 63 is formed to leave forming positions of the connecting member 301 and the holding member 302 as shown in FIG. 10. In FIG. 4E, the first insulation film 30 is etched using the formed resist pattern 63 as a mask, thereby forming the fin 31 formed on a side surface of the first sacrificial layer 61, the connecting member 301 that connects the two oscillators 21, and the holding member 302 that hold each of the oscillators 21, as shown in FIG. 10 to FIG. 11B.

In the above explanations, as the fin 31 of the thin-film encapsulation structure of the fifth embodiment, a case of applying the configuration of the first embodiment has been explained. Alternatively, the fifth embodiment can apply the configuration of the second embodiment or the third embodiment.

The fifth embodiment can also achieve effects identical to those of the first embodiment.

In the fifth embodiment, while the MEMS movable element has two oscillators provided in parallel, one oscillator can be also used, or three or more oscillators can be provided in parallel. In a sixth embodiment of the present invention, another example of a MEMS movable element arranged in a thin-film encapsulation structure is explained.

Figure 12:
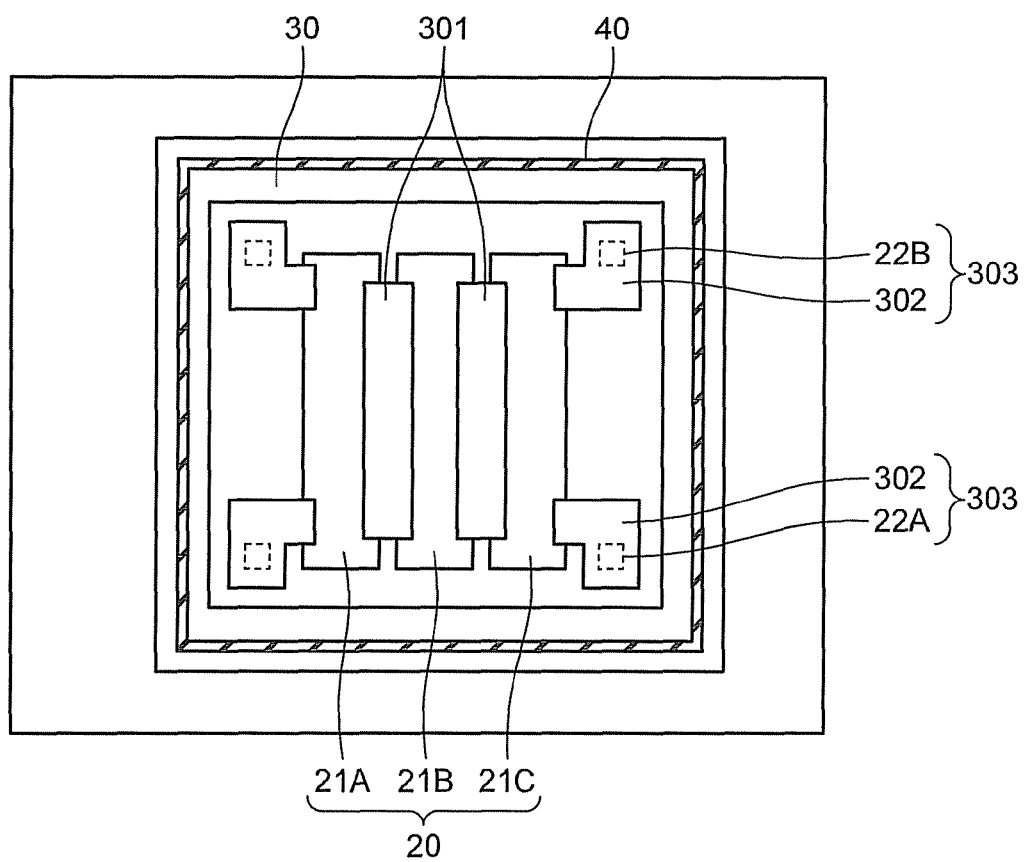
FIG. 12 is a schematic plan view of an example of a configuration of a MEMS device according to a sixth embodiment of the present invention.

FIG. 12 is a schematic plan view of an example of a configuration of a MEMS device according to the sixth embodiment. As shown in FIG. 12, the MEMS movable element 20 includes three oscillators 21A to 21C extended in the second direction at a predetermined height from the upper surface of the passivation film 12, and arranged in parallel with each other at a predetermined interval in the first direction, and the supporting units 303 that support the two oscillators 21A and 21C arranged at outside of the oscillators in the first direction. The supporting units 303 include the anchors 22A and 22B formed substantially vertically on the passivation film 12, and the holding members 302 provided at upper ends of the anchors 22A and 22B and holding the oscillators 21. The oscillators 21A and 21B are connected to each other by the connecting member 301 made of the first insulation film 30, and the oscillators 21B and 21C are also connected to each other by the connecting member 301. Although not shown, a driving wiring is provided in the oscillators 21A and 21C at both ends, and a signal line is provided in the oscillator 21B at a center.

Each of the oscillators 21A to 21C has a rectangular shape. Therefore, the fin 31 of the first insulation film 30 constituting a thin-film encapsulation structure has a shape identical to that described in the first embodiment. Constituent elements of the sixth embodiment identical to those of the fifth embodiment are denoted by like reference numerals, and explanations thereof will be omitted. A MEMS device having the configuration described above can be manufactured by a method identical to that in the fifth embodiment.

In FIG. 12, as the fin 31 with a thin-film encapsulation structure of the sixth embodiment, a case of applying the configuration of the first embodiment has been explained. Alternatively, the sixth embodiment can apply the configuration of the second embodiment or the third embodiment.

According to the sixth embodiment, because the oscillators are divided into the oscillators 21A and 21B for driving electrodes and the oscillator 21B for a signal electrode, the oscillator 21B for a signal electrode can avoid being influenced by the noise flowing through the anchors 22A and 22B at outside.

As described above, according to the embodiments of the present invention, even when a lateral oscillation or shock is externally applied to a MEMS device having a movable element formed in a encapsulation structure, destruction of the internally arranged movable element can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MEMS device comprising:
a movable element supported by a supporting member on a substrate;
an encapsulation structure provided above the substrate so as to encapsulate the movable element; and
a fin that is made of a first insulation film, provided above the substrate, and provided inside of the encapsulation structure and outside of the movable element, and
a part of the fin being positioned between a height from the substrate when the movable element is turned ON and a height from the substrate when the movable element is turned OFF, wherein a region between the movable element and the encapsulation structure has a hollow structure, the encapsulation structure includes a second insulation film with through-hole and an over-sealing layer prepared on the second insulation film and
the fin is provided outside of the movable element, is not in contact with the movable element, and does not extend over the movable element in a direction parallel to an upper horizontal surface of the substrate.

2. The MEMS device according to claim 1, wherein
the encapsulation structure includes an upper surface substantially parallel with a substrate surface, and a side surface that connects a periphery of the upper surface and the substrate, and
the first insulation film further includes an upper surface substantially parallel with the substrate surface at an upper end of the fin.

3. The MEMS device according to claim 1, wherein
the encapsulation structure includes an upper surface substantially parallel with a substrate surface, and a side surface that connects a periphery of the upper surface and the substrate, and
the fin of the first insulation film is arranged at a distance from a side surface of the encapsulation structure or is formed in contact with the side surface.

4. The MEMS device according to claim 1, wherein the first insulation film has a configuration that the fin with a width smaller than a length of the encapsulation structure is formed in a frilled shape arranged at a predetermined interval along the encapsulation structure.

5. The MEMS device according to claim 1, wherein
the supporting members are provided near an end of the movable element in a first direction.

6. The MEMS device according to claim 5, wherein the fin is provided in only a region along the first direction.

7. The MEMS device according to claim 5, wherein the supporting members are anchors in a pillar structure provided substantially vertically to the substrate and configured by a conductive material.

8. The MEMS device according to claim 7, wherein at least one of the anchors has a lower end connected to a wiring layer formed above the substrate.

9. The MEMS device according to claim 5, wherein
each of the supporting members comprises:
an anchor in a pillar structure provided substantially vertically to the substrate; and
a holding member that is made of the first insulation film and connects an upper end of the anchor and a part of the movable element.

10. The MEMS device according to claim 5, wherein the movable element has two of oscillators arranged in parallel with each other at a predetermined interval therebetween in a second direction orthogonal to the first direction, and the two oscillators are connected to each other by a connecting member made of the first insulation film.

11. The MEMS device according to claim 5, wherein
the movable element has three of oscillators arranged in parallel with each other at a predetermined interval therebetween in a second direction orthogonal to the first direction, and adjacent ones of the three oscillators are connected to each other by a connecting member made of the first insulation film, and
the supporting members are provided near an end of the oscillators in the first direction arranged at both ends of the oscillators in the second direction, and are not provided in the oscillator arranged at a center in the second direction.

12. The MEMS device according to claim 1, wherein the first insulation film is configured by a material that increases adhesiveness between the substrate and the encapsulation structure.

13. A manufacturing method of a MEMS device comprising:
forming a first sacrificial layer having substantially a trapezoidal cross-sectional surface vertical to a substrate surface, in a MEMS device forming region above a substrate;
forming, along a predetermined direction, a first through-hole that pierces through the first sacrificial layer in a thickness direction;
forming a movable element extended in the predetermined direction and supporting members that support the movable element above the substrate, by embedding the first through-hole and forming a metal film on the first sacrificial layer, and by patterning the metal film to include a forming position of the first through-hole; forming a first insulation film above the substrate on which the movable element is formed, so as to encapsulate the movable element;
etching the first insulation film to arrange the first insulation film at a predetermined distance apart from a side surface of the movable element, wherein the first insulation film is not in contact with the movable element, and does not extend over the movable element in a direction parallel to an upper horizontal surface of the substrate;
forming a second sacrificial layer having substantially a trapezoidal cross-sectional surface vertical to a substrate surface, to cover the first sacrificial layer on which the movable element is formed;
forming a second insulation film above the substrate on which the second sacrificial layer is formed;
forming a second through-hole on the second insulation film; removing the first and second sacrificial layers from the second through-hole so that a region between the movable element and the second insulation film has a hollow structure, and a fin that is made of the first insulation film is formed within a vertically movable region of the movable element at a predetermined distance from a side surface of the movable element inside the encapsulation structure; and
forming an over-sealing layer that seals the second through-hole on the second insulation film.

14. The manufacturing method of a MEMS device according to claim 13, wherein at the forming of the second sacrificial layer, the second sacrificial layer is formed to cover an upper surface of the first insulation film and a side surface that connects the upper surface and the substrate.

15. The manufacturing method of a MEMS device according to claim 13, wherein at the etching of the first insulation film, the first insulation film is etched to arrange the insulation film at a predetermined distance in only a region along a side surface of the movable element parallel with the predetermined direction.

16. The manufacturing method of a MEMS device according to claim 13, wherein at the etching of the first insulation film, the first insulation film is etched in a frilled shape.

17. A MEMS device comprising:
a movable element supported by a supporting member on a substrate;
an encapsulation structure provided above the substrate so as to encapsulate the movable element; and
a fin that is made of a first insulation film, provided above the substrate, and provided inside of the encapsulation structure and outside of the movable element, and a part of the fin being positioned between a height from the substrate when the movable element is turned ON and a height from the substrate when the movable element is turned OFF, wherein
a region between the movable element and the encapsulation structure has a hollow structure,
the encapsulation structure includes a second insulation film with through-hole and an over-sealing layer prepared on the second insulation film, and
the fin is provided within a vertically movable region of the movable element, does not come in contact with the movable element, and does not extend over the movable element in a direction parallel to an upper horizontal surface of the substrate.

18. The MEMS device according to claim 17, wherein
the encapsulation structure includes an upper surface substantially parallel with a substrate surface, and a side surface that connects a periphery of the upper surface and the substrate, and
the first insulation film further includes an upper surface substantially parallel with the substrate surface at an upper end of the fin.

19. The MEMS device according to claim 17, wherein
the encapsulation structure includes an upper surface substantially parallel with a substrate surface, and a side surface that connects a periphery of the upper surface and the substrate, and the fin of the first insulation film is arranged at a distance from a side surface of the encapsulation structure or is formed in contact with the side surface.

20. The MEMS device according to claim 17, wherein the first insulation film has a configuration that the fin with a width smaller than a length of the encapsulation structure is formed in a frilled shape arranged at a predetermined interval along the encapsulation structure.

* * * * *